(12) United States Patent
Kim et al.

(10) Patent No.: US 8,541,893 B2
(45) Date of Patent: Sep. 24, 2013

(54) SEMICONDUCTOR MEMORY DEVICE AND POWER LINE ARRANGEMENT METHOD THEREOF

(75) Inventors: Sung-Hoon Kim, Gyeonggi-do (KR);
Young-Chul Cho, Gyeonggi-do (KR);
Kwang-Il Park, Gyeonggi-do (KR);
Seong-Jin Jang, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 2268 days.

(21) Appl. No.: 11/229,257

(22) Filed: Sep. 16, 2005

(65) Prior Publication Data

US 2006/0060986 A1 Mar. 23, 2006

(30) Foreign Application Priority Data

Sep. 20, 2004 (KR) .................. 10-2004-0075233

(51) Int. Cl.
*H01L 23/48* (2006.01)
*H01L 23/52* (2006.01)
*H01L 29/40* (2006.01)

(52) U.S. Cl.
USPC .......... 257/786; 257/776; 257/734; 438/614; 438/666; 438/618; 438/622; 438/652

(58) Field of Classification Search
USPC ................. 257/503, 459, 758, E23.02, 786, 257/781, 776, 773, 750, 734; 438/612, 666, 438/614, 619, 618, 118, 622, 652
See application file for complete search history.

(56) References Cited

U.S. PATENT DOCUMENTS

| | | | |
|---|---|---|---|
| 4,780,846 A | 10/1988 | Tanabe et al. | |
| 6,476,459 B2 | 11/2002 | Lee | |
| 2001/0010408 A1 | 8/2001 | Ker et al. | |
| 2001/0035555 A1 | 11/2001 | Nonaka | |
| 2002/0017672 A1 | 2/2002 | Ker et al. | |
| 2002/0140002 A1* | 10/2002 | Suzuki et al. | ........ 257/207 |
| 2003/0067066 A1 | 4/2003 | Kondou | |

FOREIGN PATENT DOCUMENTS

| | | |
|---|---|---|
| EP | 0259631 | 5/1993 |
| JP | 02226756 | 9/1990 |
| JP | 05166930 | 7/1993 |
| JP | 10242284 | 9/1998 |
| JP | 10335333 | 12/1998 |
| JP | 2001101860 | 4/2001 |
| JP | 2002-164437 | 6/2002 |
| JP | 2003282573 | 10/2003 |
| JP | 2003289104 | 10/2003 |
| KR | 2004-0006744 | 1/2004 |

OTHER PUBLICATIONS

English language abstract of Japanese publication No. 2002-164437.
English language abstract of Korean publication No. 2004-0006744.
Japanese Office Action Dated Apr. 3, 2012 Corresponding to Japanese Patent Application No. 2005-270779.

* cited by examiner

*Primary Examiner* — Thanh Y Tran
(74) *Attorney, Agent, or Firm* — volentine & Whitt, PLLC

(57) ABSTRACT

A semiconductor memory device and a power line arrangement method are disclosed. The semiconductor memory device includes a plurality of pads, each pad including an upper pad and a lower pad arranged below the upper pad, wherein pad power lines are arranged below the lower pads of the plurality of pads in a direction of crossing the pads to interconnect the pads that transmit the same level of electrical power among the plurality of pads.

35 Claims, 11 Drawing Sheets

SEMICONDUCTOR MEMORY DEVICE AND POWER LINE ARRANGEMENT METHOD THEREOF

CROSS-REFERENCE TO RELATED APPLICATION

This application claims the benefit of Korean Patent Application No. 2004-75233, filed Sep. 20, 2004, the disclosure of which is hereby incorporated herein by reference in its entirety.

BACKGROUND OF THE INVENTION

1. Field of the Invention

The present invention relates to a semiconductor memory device and, more particularly, to a semiconductor memory device and a power line arrangement method thereof.

2. Description of the Prior Art

Power lines of a conventional semiconductor memory device are arranged on two layers like signal lines. The power lines on a first layer and the power lines on a second layer are arranged in perpendicular direction to each other to make grid-shape connections because the electrical power can be more stably supplied via grid-shape connections.

Among the power lines of the conventional semiconductor memory device, some power lines may be directly supplied with the electrical power from a power supply input pad. In such instance, the power lines which are supplied with electrical power from the pad form grid-shape connections, but the pad just functions to supply the electrical power and does not form the grid-shape connections together with the power lines.

FIG. 1 is a schematic diagram illustrating a power line arrangement method of a conventional semiconductor memory device. In FIG. 1, reference numerals 10, 20, 30, and 40 denote a memory cell array, a row decoder, a column decoder, and a data control and internal voltage generator, respectively.

In FIG. 1, non-hatched lines denote power lines arranged on a first layer, hatched lines denote power lines arranged on a second layer, and "PVDD" and "PVSS" denote power voltage applying pads and ground voltage applying pads, respectively.

The lower line arrangement method of the conventional semiconductor memory device will be explained below with reference to FIG. 1.

In the first layer, array power lines AP1 are arranged in a longitudinal direction above the memory cell array 10, peripheral circuit power lines PPVDD1 and PPVSS1 are arranged in a longitudinal direction above the row decoder 20, and peripheral circuit power lines PPVDD1 and PPVSS1 are arranged in a transverse direction above the column decoder 30 and the data control and internal voltage generator 40, respectively.

In the second layer, array power lines AP2 are arranged above the memory cell array 10 in a perpendicular direction to the array power lines AP1; peripheral circuit power lines PPVDD2 and PPVSS2 are arranged above the row decoder 20 in a perpendicular direction to the peripheral circuit power lines PPVDD1 and PPVSS1; and peripheral circuit power lines PPVDD2 and PPVSS2 are arranged above the column decoder 30 and the data control and internal power voltage generator 40 in a perpendicular direction to the peripheral circuit power lines PPVDD1 and PPVSS1. In the second layer, subperipheral circuit power lines PPVDD2' and PPVSS2' extend respectively from pads PVDD and PVSS to be connected to the peripheral circuit power lines PPVDD1 and PPVSS1, and a subperipheral circuit power line PPVSS2' extends from the pad PVSS to be connected to the peripheral circuit power line PPVSS2.

FIG. 2A is a plan view illustrating the pad of FIG. 1, and FIG. 2B is a cross-sectional view taken along line X-X' of FIG. 2A.

As shown in FIG. 2B, the pad includes a dummy portion and a signal line portion. The dummy portion includes a dummy diffusion layer, an insulating layer, and a dummy polysilicon layer for matching a step height with the memory cell array 10 and a peripheral circuit. Here, the peripheral circuit includes the row decoder 20, the column decoder 30, and the data control and internal voltage generator 40 except the memory cell array 10. The signal line portion includes a lower metal pad DPAD arranged on a first layer 1F and an upper metal pad UPAD arranged on a second layer 2F. A conductive layer COD is arranged between the lower and upper metal pads DPAD and UPAD to electrically connect the lower and upper metal pads DPAD and UPAD to each other. The conductive layer COD is formed using a technique for forming a contact. That is, the pad includes the upper metal pad UPAD, the conductive layer COD and the lower metal pad DPAD which are arranged in the signal line portion, and the lower metal pad DPAD functions to absorb an impact which may occur when the conductive layer COD is formed.

As shown in FIG. 2B, the pad of the conventional memory device includes two layers: the upper metal pad UPAD which is directly supplied with the electrical power externally applied and the lower metal pad DPAD which absorbs an impact when the conductive layer is formed.

In general, as the number of grid-shape connections is increased, the electrical power can be more stably supplied, but the conventional semiconductor memory device has a disadvantage in that it is difficult to make a connection between the pads. That is, if the power voltage applying pad PVDD and the ground voltage applying pad PVSS are alternately arranged as shown in FIG. 1, it is impossible to make connection between the pads PVDD which apply a voltage of the same level due to the pad power line PVSS2 arranged on the second layer. Thus, since there are no connections between the power voltage applying pads PVDD and between the ground voltage applying pads PVSS, more stable electrical power can not be supplied.

On the other hand, unlike FIG. 1, if the power voltage applying pads PVDD are arranged concentrically on one side and the power voltage applying pads PVSS are arranged concentrically on the other side, it is possible to make connection between the power voltage applying pads PVDD. However, this arrangement requires a space between the pads PVDD and PVSS and the row decoder 20 for making connections between the power voltage applying pads PVDD and between the ground voltage applying pads PVSS, leading to increased layout area size of the semiconductor memory device.

SUMMARY OF THE INVENTION

The present invention is directed to a power line arrangement of a semiconductor memory device which can stably supply electrical power without increasing layout area size.

A first aspect of a semiconductor memory device of the present invention includes: a plurality of pads, each pad including an upper pad and a lower pad arranged below the upper pad, wherein pad power lines are arranged below the lower pads of the plurality of pads in a direction of crossing the pads to connect the pads which transmit the same level of electrical power among the plurality of pads.

The upper and lower pads and the pad power lines can be made of a metal. In an embodiment of the invention upper and lower pads are made of a metal, and the pad power lines are made of tungsten.

The upper and lower pads of each of the plurality of pads are electrically connected, and the lower pads and the pad power lines which transmit the same level of electrical power as the lower pads among the pad power lines are electrically connected.

A second aspect of a semiconductor memory device of the present invention includes: a plurality of pads, each pad including an upper pad and a lower pad arranged below the upper pad, wherein pad power lines are arranged below the lower pads of the plurality of pads in a direction of crossing the pads to connect the pads which transmit the same level of electrical power among the plurality of pads, and sub pad power lines are arranged in a perpendicular direction to the pad power lines.

The pad power lines and the sub pad power lines can transmit the same level of electrical power and can be arranged on the same layer. Or the pad power lines and the sub pad power lines can transmit a different level of electrical power, and the sub pad power lines can be arranged below a layer where the pad power lines are arranged.

The upper and lower pads and the pad power lines can be made of a metal, and the sub pad power lines can be made of tungsten. Or the upper and lower pads, the pad power lines and the sub pad power lines can be made of a metal.

The upper and lower pads of each of the plurality of pads are electrically connected, and the lower pads and the power lines which transmit the same level of electrical power as the lower pads among the pad power lines and the sub pad power lines are electrically connected.

In the first and second aspects of the semiconductor memory device, the pad power lines can transmit at least one of a power voltage power and a ground voltage power, or the pad power lines can transmit at least one of a power voltage power, a ground voltage power, a substrate voltage power, a high voltage power, and a reference voltage power.

A third aspect of a semiconductor memory device of the present invention includes: a memory cell array; a peripheral circuit for controlling data input/output to/from the memory cell array; and a plurality of pad supplied with an electrical power externally applied, wherein array and peripheral circuit power lines for supplying the electrical power to the memory cell array and the peripheral circuit are arranged above the memory cell array and the peripheral circuit, upper and lower pads of each of the plurality of pads are arranged on two layers which are the same layers as the array and peripheral circuit power lines, and pad power lines crossing the pads are arranged below the lower pads of the plurality of pads to connect the pads which transmit the same level of electrical power among the plurality of pads.

The array and peripheral circuit power lines can be arranged on three layers in a perpendicular direction to each other, in which arrangement the pad power lines can be arranged on a first layer, the lower pads can be arranged on a second layer, and the upper pads can be arranged on a third layer.

The semiconductor memory device can further include sub pad power lines arranged in a perpendicular direction to the pad power lines, wherein the sub pad power lines can be arranged in a dummy portion formed below the lower pad for matching a step height with the memory cell array and the peripheral circuit.

The array and peripheral circuit power lines can be arranged on two layers, and the pad power lines can be arranged in a dummy portion formed below the lower pad to match a step height with a region where the memory cell array and the peripheral circuit.

The upper and lower pads can be made of a metal, and the pad power lines can be made of tungsten.

Sub pad power lines can be additionally arranged in a perpendicular direction to the pad power lines; the pad power lines, the upper and lower pads can be separately arranged in different three layers; and some of the sub pad power lines can be arranged in the same layer as the pad power lines; and the rest of the sub power lines can be arranged in a different layer from the pad power lines and the upper and lower pads.

The pad power lines, the upper and lower pads, and the sub pad power lines can be made of a metal.

The array and peripheral circuit power lines can be arranged on at least two layers to overlap, and the power lines can be arranged to overlap transmit different level of electrical powers.

One of the power lines arranged to overlap and one of the power lines adjacent to the power lines arranged to overlap can be lines transmitting the same level of electrical power. One of the power lines which transmit the same level of electrical power and are arranged to overlap and one of the adjacent power lines can be arranged in different layers.

A fourth aspect of a semiconductor memory device of the present invention includes: a memory cell array; a peripheral circuit for controlling data input/output to/from the memory cell array; and a plurality of pad supplied with an electrical power externally applied, wherein array and peripheral circuit power lines for supplying the electrical power to the memory cell array and the peripheral circuit can be arranged on at least three layers to cross above the memory cell array and the peripheral circuit, the array and peripheral circuit power lines arranged on at least two layers among the at least three layers can be arranged to overlap, and the power lines arranged to overlap can be lines which transmit different level of electrical power.

One of the power lines arranged to overlap and one of the adjacent power lines are lines transmitting the same level of electrical power, and one of the power lines which transmit the same level of electrical power and are arranged to overlap and one of the adjacent power lines are arranged on different layers.

The semiconductor memory device can further include upper and lower pads of each of the plurality of pads arranged on two layers which are the same layers as the array and peripheral circuit power lines, and pad power lines crossing the pads can be arranged below the lower pads of the plurality of pads to connect the pads which transmit the same level of electrical power among the plurality of pads.

The array and peripheral circuit power lines can be arranged on three layers in a perpendicular direction to each other, in which arrangement the pad power lines can be arranged on a first layer, the lower pads can be arranged on a second layer, and the upper pads can be arranged on a third layer.

The semiconductor memory device can further include sub pad power lines arranged in a perpendicular direction to the pad power lines, wherein the sub pad power lines are arranged in a dummy portion formed below the lower pad for matching a step height with the memory cell array and the peripheral circuit.

The peripheral circuit can include a predetermined number of internal voltage generators which generate different level of voltages, and a predetermined number of power lines for supplying the respective internal voltage generators with the electrical power from the upper pads of the plurality of pads are arranged in the same layer as the upper pads.

A predetermined number of the power lines for supplying the respective internal voltage generators with the electrical power from the lower pads of the plurality of pads can be arranged in the same layer as the lower pads.

A first aspect of a method of power line arrangement in a semiconductor memory device including a memory cell array, a peripheral circuit for controlling data input/output to/from the memory cell array, and a plurality of pad supplied with an electrical power externally applied, includes: arranging array and peripheral circuit power lines of the memory cell array and the peripheral circuit on at least two layers; arranging upper and lower pads of each of the plurality of pads on the two same layers as layers where the array and peripheral circuit power lines are arranged; and arranging pad power lines below the lower pads of the plurality of pads in a direction of crossing the pads to connect the pads which transmit the same level of electrical power among the plurality of pads.

A second aspect of a method of power line arrangement in a semiconductor memory device including a memory cell array, a peripheral circuit for controlling data input/output to/from the memory cell array, and a plurality of pad supplied with an electrical power externally applied, includes: arranging array and peripheral circuit power lines for supplying the electrical power to the memory cell array and the peripheral circuit on at least three layers to cross above the memory cell array and the peripheral circuit; and arranging the array and peripheral circuit power lines on at least two layers among the at least three layers are arranged to overlap, wherein the power lines arranged to overlap are lines which transmit different level of electrical power.

BRIEF DESCRIPTION OF THE DRAWINGS

The above and other features and advantages of the present invention will become more apparent to those skilled in the art by describing in detail preferred embodiments thereof with reference to the attached drawings in which.

DETAILED DESCRIPTION OF THE INVENTION

Figure 1:
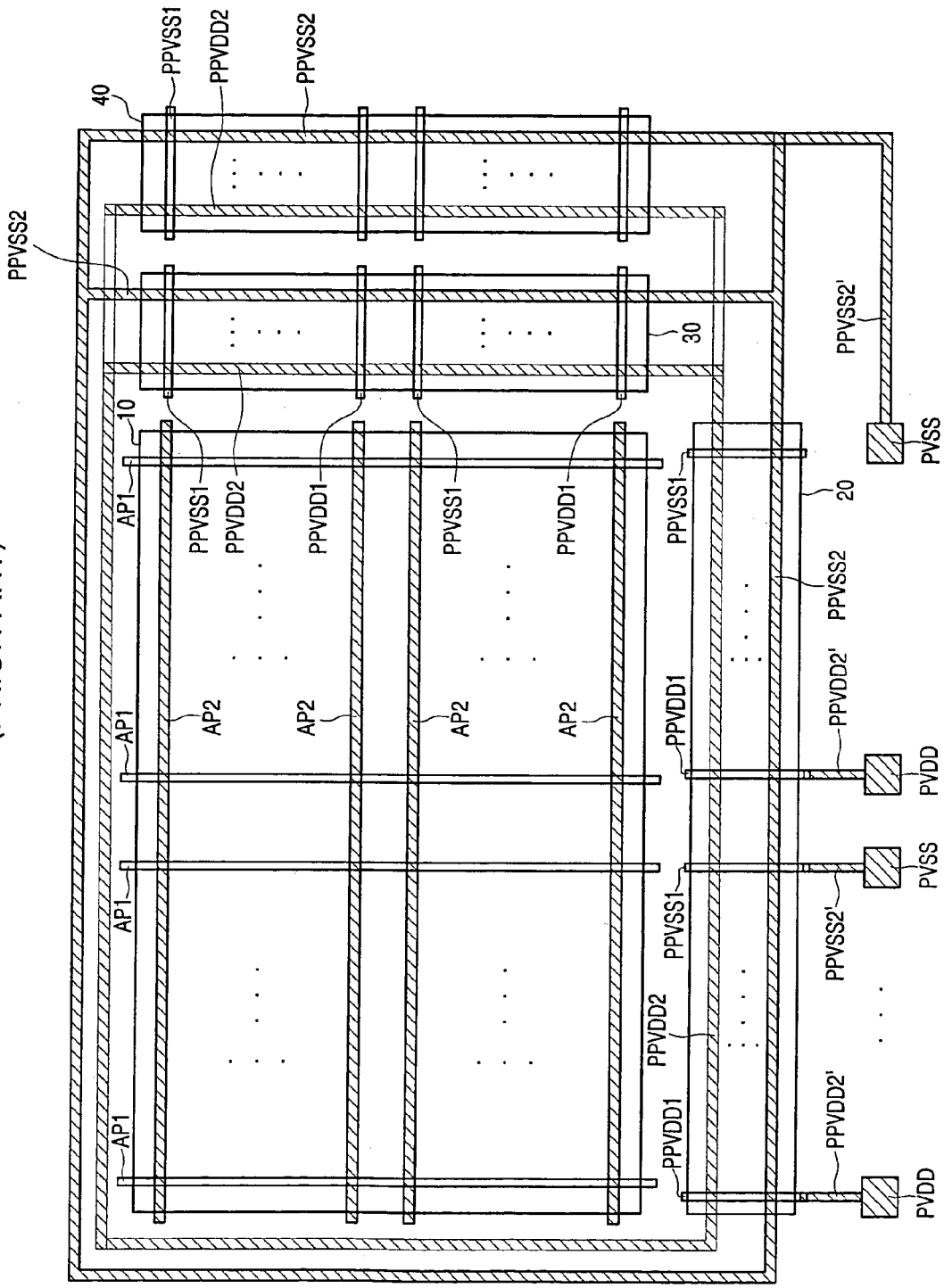
FIG. 1 is a schematic diagram illustrating a power line arrangement method of a conventional semiconductor memory device.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 3:
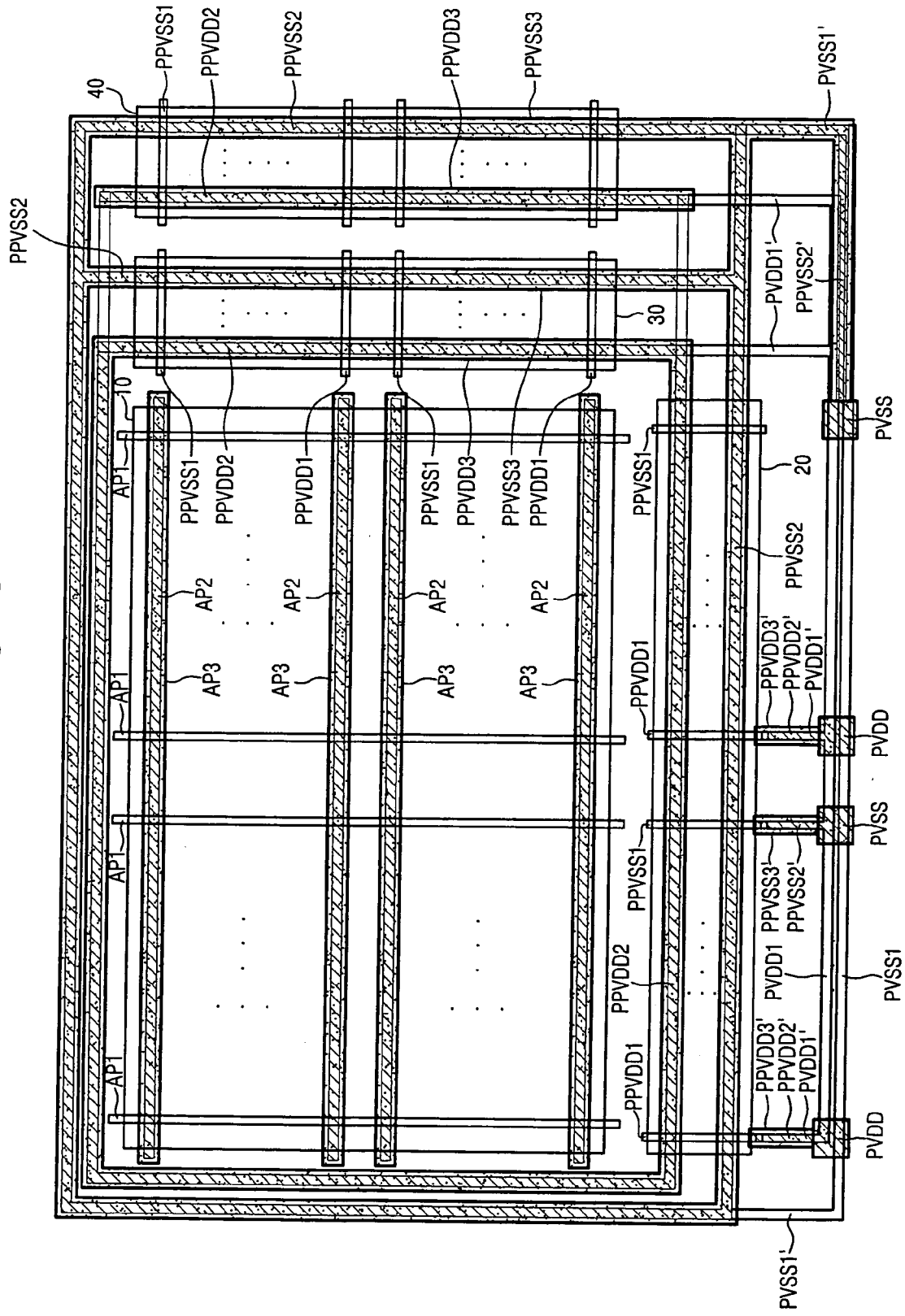
FIG. 3 is a schematic diagram illustrating a power line arrangement method of a semiconductor memory device according to a first embodiment of the present invention.

FIG. 3 is a schematic diagram illustrating a power line arrangement method of a semiconductor memory device according to a first embodiment of the present invention. Like reference numerals of FIGS. 1 and 3 denote like parts and like lines. Like lines of FIG. 1, non-hatched lines denote lines arranged in the first layer and hatched lines denote power line arranged in the second layer. Lines filled with dots denote lines arranged in a third layer.

In the semiconductor memory device of FIG. 3, power lines are arranged on three layers. Arrangement of power lines AP1, AP2, PPVDD1, PPVSS1, PPVDD2, PPVSS2, PPVSS2', and PPVDD2' in the first and second layers above the memory cell array 10, the row decoder 20, the column decoder 30, and a data control and internal voltage generator 40 is the same as that of FIG. 1 except that pad power lines PVDD1 and PVSS1 are additionally arranged in the first layer below the pads PVDD and PVSS. The pad power lines PVDD1 and PVSS1 are arranged in a direction crossing the pads PVDD and PVSS to connect the pads PVDD and PVSS to which the same level of power is applied below the pads PVDD and PVSS Sub pad power lines PVDD1' which extend from the pad power line PVDD1 may be additionally arranged to connect the pad power line PVDD1 and the peripheral circuit power lines PPVDD1. Further, sub power lines PVSS1' which extend from the pad power line PVSS1 may be additionally arranged to connect the pad power line PVSS1 and the peripheral circuit power lines PPVSS1.

Array power lines AP3 are arranged on the third layer above the memory cell array 10 to overlap the array power lines AP2 arranged on the second layer, and peripheral circuit power lines PPVDD3 and PPVSS3 are arranged on the third layer above the row decoder 20, the column decoder 30, and the data control and internal voltage generator 40 to overlap the peripheral circuit power lines PPVDD2 and PPVSS2 arranged on the second layer.

Sub peripheral circuit power lines PPVDD3' and PPVSS3' may be arranged which are arranged to overlap the upper and lower metal pads of the respective pads PVDD and PVSS in the second and third layers and extend from the upper metal pad of the pads PVDD and PVSS for connecting the upper metal pads of the pads PVDD and PVSS arranged in the third layer and the peripheral circuit power lines PPVDD1 and PPVSS1.

Even though not shown in FIG. 3, there exist connections between the power lines which transmit the same level of power. For example, there exists a connection between the power voltage applying pads PVDD and the power line PVDD1, and there exists a connection between the ground voltage applying pads PVSS and the power line PVSS1.

In cases in which the power lines (or signal and power lines) of the semiconductor memory device are arranged in the three layers as shown in FIG. 3, the pads PVDD and PVSS are configured using the second and third layers, and the pad power lines PVDD1 and PVSS1 which form connections between the pads PVDD and between the pads PVSS, which transmit the same level of electrical power, are arranged below the pads PVDD and PVSS. As a result, connections can be formed between the pads PVDD and between the pads PVSS without increasing the layout area size of the semiconductor memory device, thereby stably supplying the electrical power.

Figure 4A:
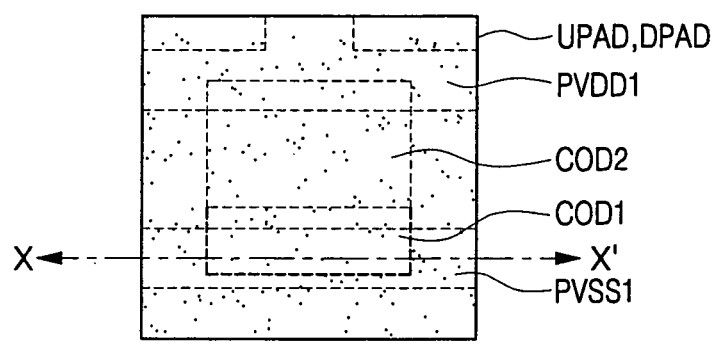
FIG. 4A is a plan view of the pad of FIG. 3.
Figure 4B:
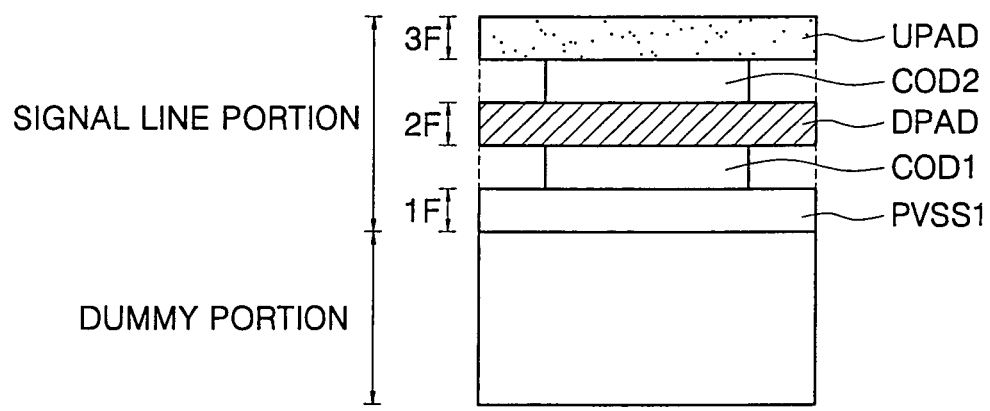
FIG. 4B is a cross-sectional view taken along line X-X' of FIG. 4A.

FIG. 4A is a plan view of the pad of FIG. 3, and FIG. 4B is a cross-sectional view taken along line X-X' of FIG. 4A. FIGS. 4A and 4B show the ground voltage applying pad PVSS.

As shown in FIG. 4B, the ground voltage applying pad includes a dummy portion and a signal line portion. The dummy portion includes a dummy diffusion layer, an insulating layer, and a dummy polysilicon layer for matching a step height with the memory cell array 10 and a peripheral circuit. The signal line portion includes a pad power line PVSS1 arranged in a first layer, a lower metal pad DPAD arranged in a second layer, and an upper metal pad UPAD arranged in a third layer. A conductive layer COD1 is arranged to electrically connect the pad power line PVSS1 and the lower metal pad DPAD, and a conductive layer COD2 is arranged to electrically connect the lower metal pad DPAD and the upper metal pad UPAD. The conductive layers may be formed using a contact forming technique. That is, the pad includes the upper and lower metal pads UPAD and DPAD arranged in the signal line portion, and the pad power line PVSS1 is arranged below the lower metal pad DPAD to connect the upper and lower metal pads UPAD and DPAD.

Accordingly, a connection can be formed between the pads PVSS by the pad power line PVSS1. Likewise, a connection can be formed between the pads PVDD by the pad power line PVDD1.

That is, the semiconductor memory device is configured such that the upper and lower metal pads UPAD and DPAD are arranged respectively in the second and third layers and the pad power lines PVDD1 and PVSS1 are arranged in the first layer to connect respectively the pads PVDD and the pads PVSS.

Figure 5:
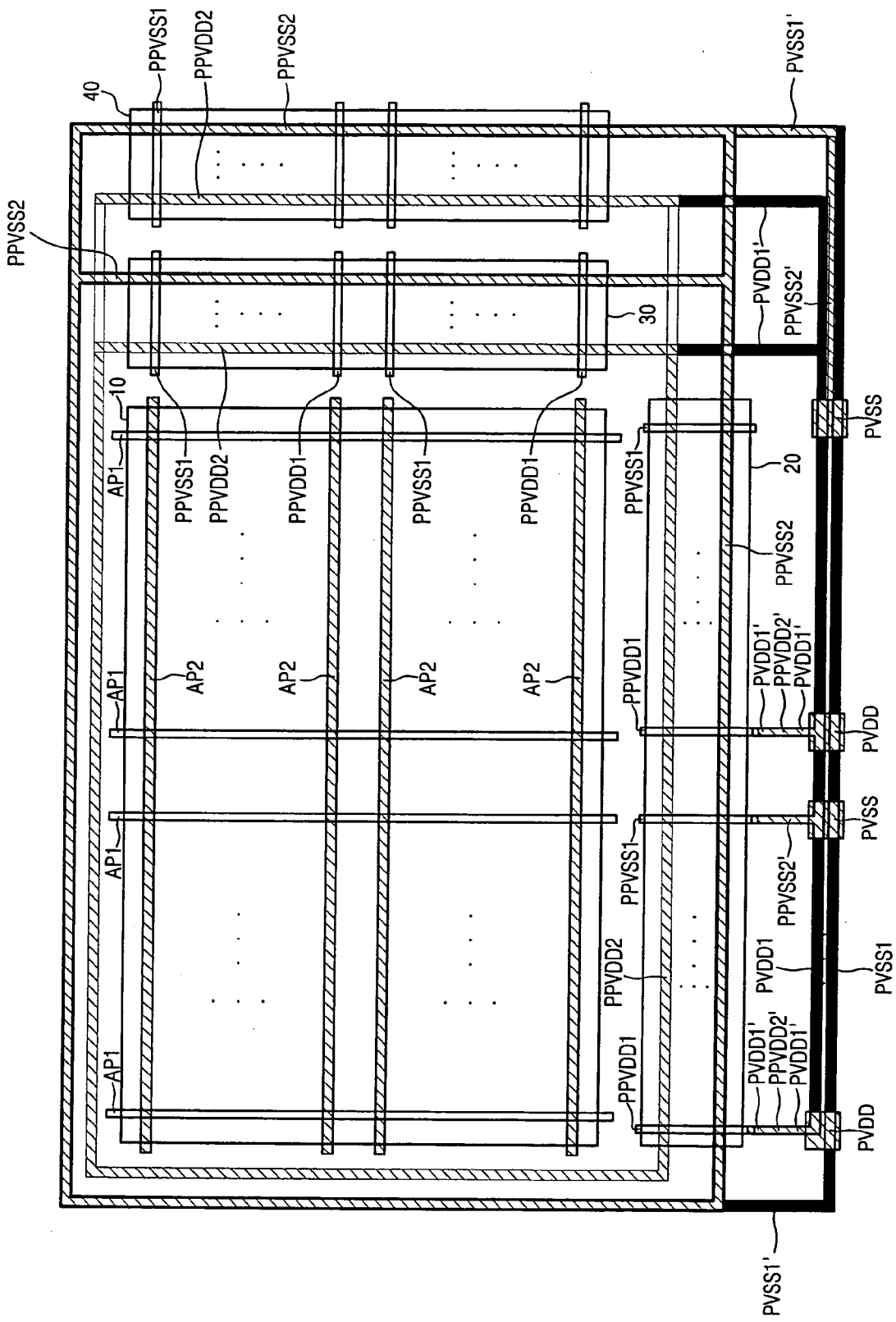
FIG. 5 is a schematic diagram illustrating a power line arrangement method of a semiconductor memory device according to a second embodiment of the present invention.

FIG. 5 is a schematic diagram illustrating a power line arrangement method of a semiconductor memory device according to a second embodiment of the present invention. Like reference numerals of FIGS. 1 and 5 denote like parts and like lines. Like lines of FIG. 1, non-hatched lines denote lines arranged in the first layer and hatched lines denote line arranged in the second layer. Black color lines denote lines arranged in the dummy portion.

In the semiconductor memory device of FIG. 5, power lines are arranged on two layers. Arrangement of power lines PPVDD1, PPVSS1, PPVDD2, and PPVSS2 which are arranged in the first and second layers above the memory cell array 10, the row decoder 20, the column decoder 30, and a data control and internal voltage generator 40 is the same as that of FIG. 1 except that pad power lines PVDD1 and PVSS1 are additionally arranged in the dummy portion below the pads PVDD and PVSS. The pad power lines PVDD1 and PVSS1 are arranged in a direction crossing the pads PVDD and PVSS to connect the pads PVDD and PVSS to which the same level of power is applied below the pads PVDD and PVSS. Sub pad power lines PVDD1' which extend from the pad power line PVDD1 are additionally arranged to connect the pad power line PVDD1 and the peripheral circuit power lines PPVDD1 and PPVDD2. Sub power lines PVSS1' which extend from the pad power line PVSS1 are additionally arranged to connect the pad power line PVSS1 and the peripheral circuit power lines PPVSS1 and PPVSS2.

Upper metal pads of the respective pads PVDD and PVSS are arranged in the first layer, and lower metal pads of the respective pads PVDD and PVSS are arranged in the second layer.

Even though not shown in FIG. 5, there exist connections between the power lines which transmit the same level of electrical power. For example, there exists a connection between the power voltage applying pads PVDD and the pad power line PVDD1, and there exists a connection between the ground voltage applying pads PVSS and the pad power line PVSS1.

When the power lines (or signal and power lines) of the semiconductor memory device are arranged in two layers as shown in FIG. 5, the pads PVDD and PVSS are configured using the first and second layers. The pad power lines PVDD1 and PVSS1 that form connections between the pads PVDD and between the pads PVSS, which respectively transmit the same levels of power, are arranged in the dummy portion below the pads PVDD and PVSS. As a result, connections can be formed between the pads PVDD and between the pads PVSS without increasing the layout area size of the semiconductor memory device, thereby stably supplying the electrical power.

Figure 6A:
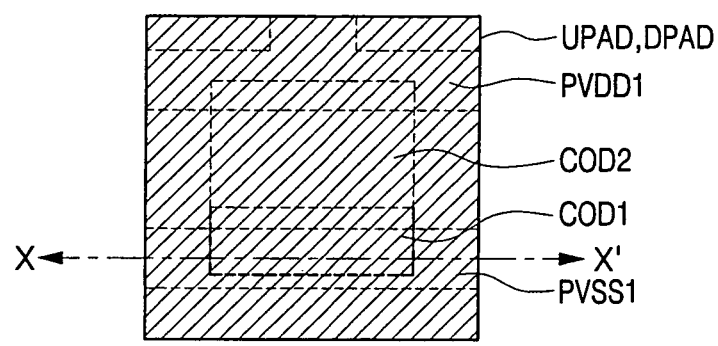
FIG. 6A is a plan view of the pad of FIG. 5.
Figure 6B:
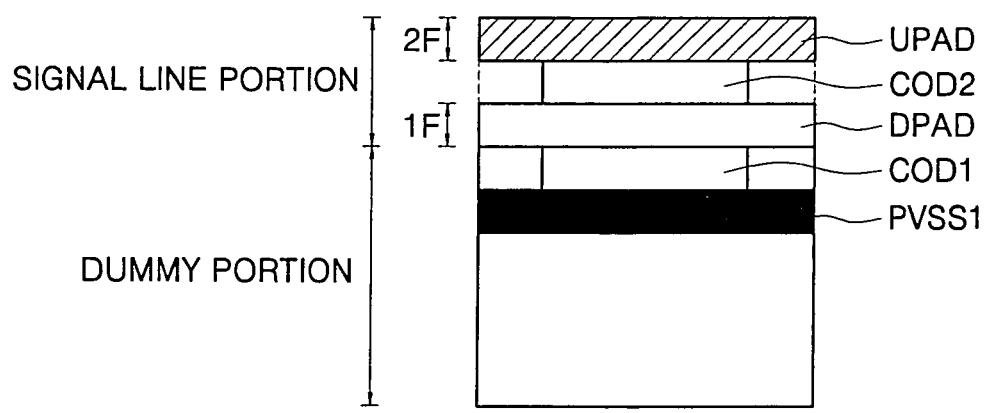
FIG. 6B is a cross-sectional view taken along line X-X' of FIG. 6A.

FIG. 6A is a plane view of the pad of FIG. 5, and FIG. 6B is a cross-sectional view taken along line X-X' of FIG. 6A. FIGS. 6A and 6B show the ground voltage applying pad PVSS.

Figure 2A:
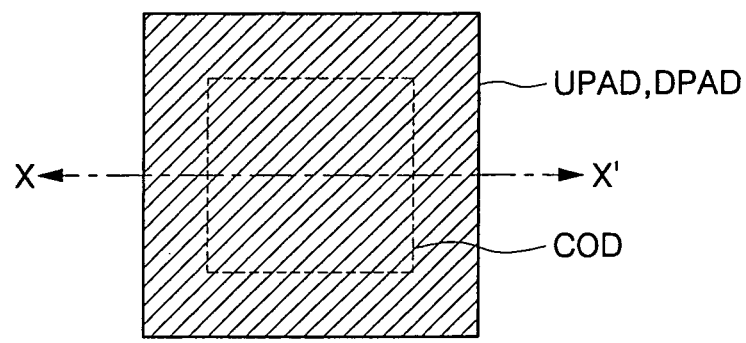
FIG. 2A is a plan view illustrating the pad of FIG. 1.
Figure 2B:
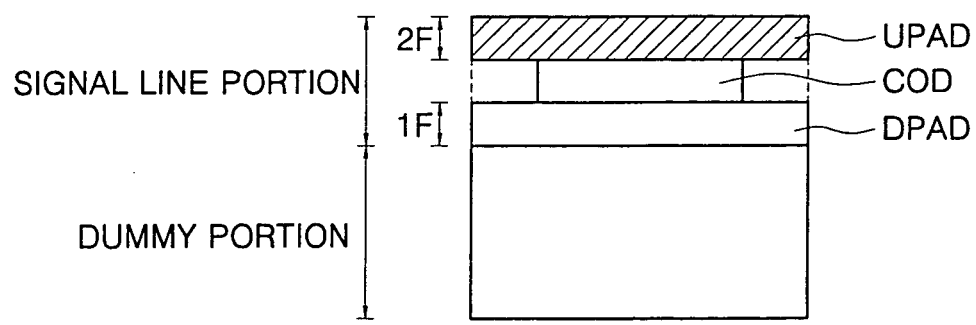
FIG. 2B is a cross-sectional view taken along line X-X' of FIG. 2A.

As shown in FIG. 6B, the ground voltage applying pad includes a dummy portion and a signal line portion. The dummy portion includes a dummy diffusion layer, an insulating layer, and a dummy polysilicon layer for matching a step height with the memory cell array 10 and a peripheral circuit. Here, the pad power line PVSS1 is arranged in one of the above described layers. A conductive layer COD1 is arranged to electrically connect the pad power line PVSS1 and the lower metal pad DPAD. Like FIG. 2B, the upper and lower metal pads DPAD and UPAD are arranged respectively in the first and second layers, and a conductive layer COD2 is arranged to electrically interconnect the lower metal pad DPAD and the upper metal pad UPAD. The conductive layers COD1 and COD2 may be formed using a contact forming technique. Accordingly, a connection can be formed between the pads PVSS by the pad power line PVSS1. Likewise, a connection can be formed between the pads PVDD by the pad power line PVDD1.

The power lines and the power pads arranged in the signal line portions may be made of a metal such as aluminum, and the power lines PVSS1 and the pad power line PVDD1 arranged in the dummy portion may be made of a refractory metal such as tungsten.

Figure 7:
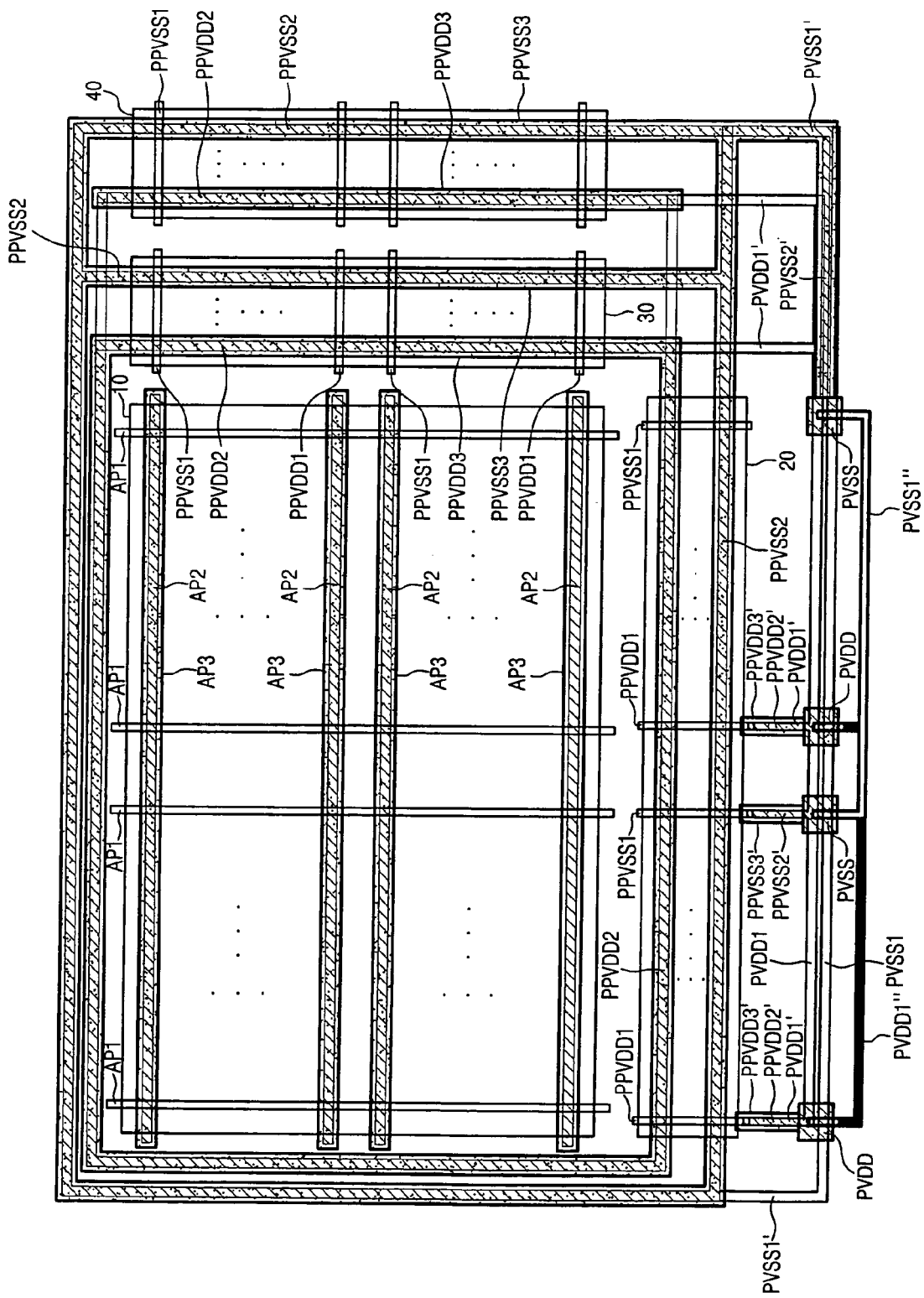
FIG. 7 is a schematic diagram illustrating a power line arrangement method of a semiconductor memory device according to a third embodiment of the present invention.

FIG. 7 is a block diagram illustrating a power line arrangement method of a semiconductor memory device according to a third embodiment of the present invention. Like reference numerals of FIGS. 1 and 7 denote like parts and like lines. Like lines of FIG. 1, non-hatched lines denote lines arranged in the first layer and hatched lines denote line arranged on the second layer. Lines filled with dots are lines arranged in a third layer, and black color lines are lines arranged in the dummy portion.

In the semiconductor memory device of FIG. 7, power lines are arranged in three layers. Arrangement of power lines which are arranged in the first to third layers above the memory cell array 10, the row decoder 20, the column decoder 30, and a data control and internal voltage generator 40 is the same as that of FIG. 3. Like FIG. 3, the pads PVDD and PVSS are also arranged in the second and third layers, and the pad power lines PVDD1 and PVSS1 are additionally arranged in the first layer below the pads PVDD and PVSS. The difference is that a sub pad power line PVDD1" which extends in a perpendicular direction to the pad power lines PVDD1 to connect the pads PVDD is additionally arranged in the dummy portion and a sub pad power line PVSS1" which extends in a perpendicular direction to the pad power lines PVSS1 to connect the pads PVSS is additionally arranged in the first layer below the pads PVDD and PVSS.

Even though not shown in FIG. 7, there exist connections between the power lines which transmit the same level of power. For example, there exists a connection between the power voltage applying pads PVDD and the power lines PVDD1 and PVDD1", and there exists a connection between the ground voltage applying pads PVSS and the power lines PVSS1 and PVSS1".

When the power lines (or signal and power lines) of the semiconductor memory device are arranged in the three layers as shown in FIG. 7, the pads PVDD and PVSS are configured using the second and third layers, and the pad power lines PVDD1 and PVDD1" and pad power lines PVSS1 and PVSS1" which respectively form connections between the pads PVDD and between the pads PVSS, which transmit the same levels of electrical power, are arranged in a perpendicular direction below the pads PVDD and PVSS and in the dummy portion, respectively. As a result, connections can be formed between the pads PVDD and between the pads PVSS without increasing the layout area size of the semiconductor memory device, thereby stably supplying the electrical power.

Figure 8A:
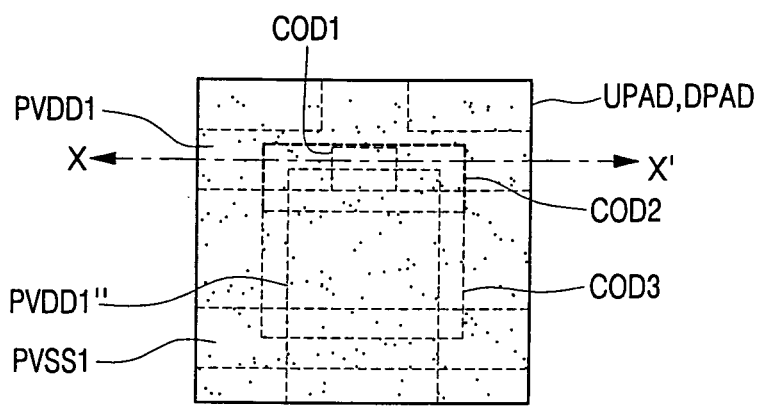
FIG. 8A is a plan view of the pad of FIG. 7.
Figure 8B:
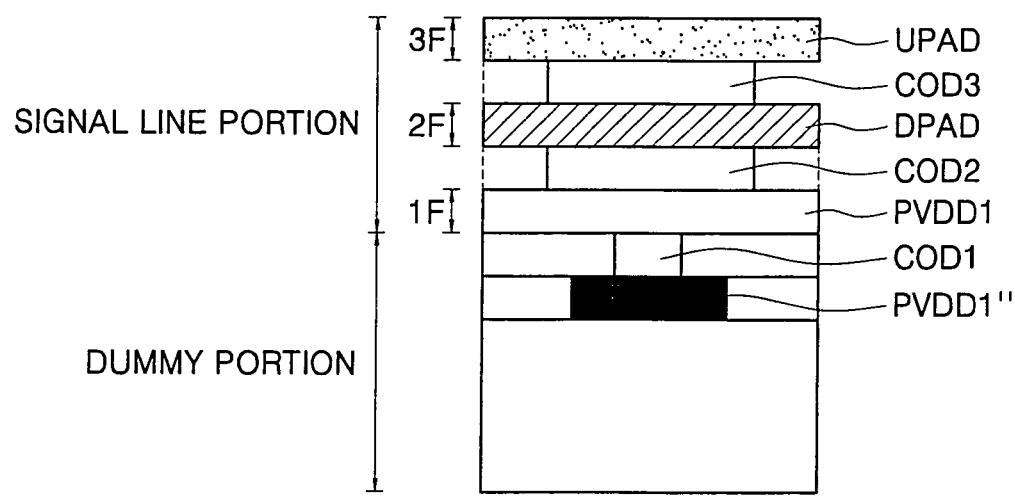
FIG. 8B is a cross-sectional view taken along line X-X' of FIG. 8A.

FIG. 8A is a plan view of the pad of FIG. 7, and FIG. 8B is a cross-sectional view taken along line X-X' of FIG. 8A. FIGS. 8A and 8B show the power voltage applying pad PVDD.

As shown in FIG. 8B, the power voltage applying pad includes a dummy portion and a signal line portion. The dummy portion includes a dummy diffusion layer, an insulating layer, and a dummy polysilicon layer for matching a step height with the memory cell array 10 and a peripheral circuit. Here, the pad power line PVDD1 is arranged in one of the above described layers. The pad power line PVDD1 is arranged in the first layer of the signal line portion, a conductive layer COD1 for electrically connecting the sub pad power line PVDD1" and the pad power line PVDD1 is arranged therebetween. The lower metal pad DPAD is arranged in the second layer of the signal line portion, and a conductive layer COD2 for electrically connecting the lower metal pad DPAD and the pad power line PVDD1 is arranged therebetween. The upper metal pad UPAD is arranged in the third layer of the signal line portion, and a conductive layer COD3 for electrically connecting the upper and lower metal pads UPAD and DPAD is arranged therebetween.

The power lines and the pads arranged in the signal line portion may be made of a metal, and the power lines arranged in the dummy portion may be made of tungsten, as described above.

As described above, when the power lines of the memory cell array and the peripheral circuit are arranged in two or three layers, the semiconductor memory device is configured such that the pads are arranged in two layers and the power lines for connecting the pads which apply the same level of electrical power are arranged in the dummy portion or in the first layer of the signal line portion in a direction crossing the pads. The power lines are additionally arranged in a perpendicular direction to the power line for connecting the pads. Accordingly, the pads become part of the grid-shape power lines, and thus larger grid-shape connections can be formed, thereby stably supplying the electrical power.

In the above described embodiments, the power lines are arranged in one layer of the dummy portion. However, the power lines may be additionally arranged in other layers of the dummy portion. Alternatively, the power lines may be arranged in four layers of the signal line portion without using the dummy portion.

Figure 9:
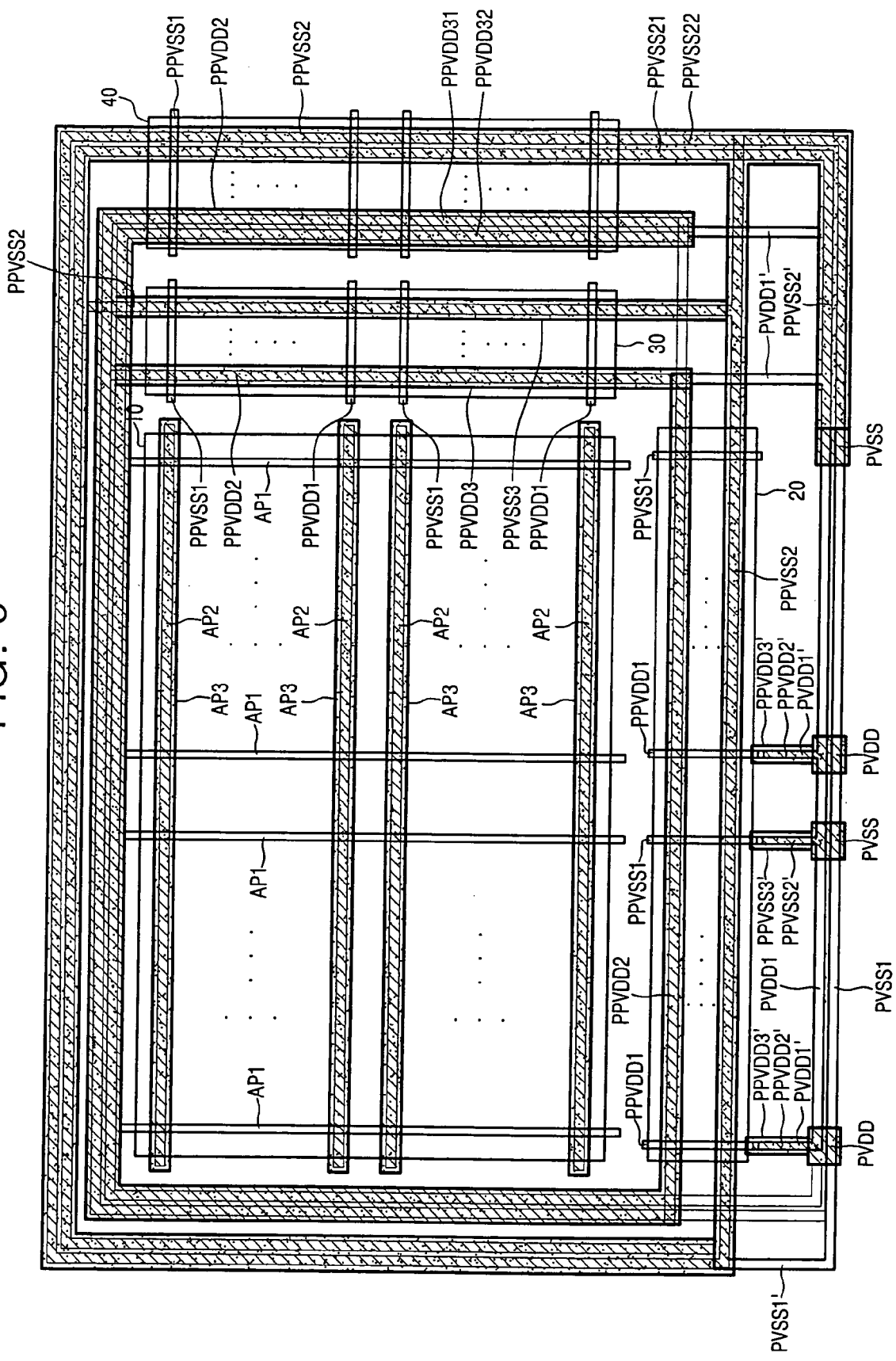
FIG. 9 is a schematic diagram illustrating a power line arrangement method of a semiconductor memory device according to a fourth embodiment of the present invention.

FIG. 9 is a block diagram illustrating a power line arrangement method of a semiconductor memory device according to a fourth embodiment of the present invention. Like reference numerals of FIGS. 3 and 9 denote like parts and like lines.

The power line arrangement method of the semiconductor memory device of FIG. 9 is the same as that of FIG. 3 except that when a predetermined number of internal voltage generators in the data control and internal voltage generator 40 are arranged to generate a predetermined number of different level voltages, peripheral circuit power lines PPVDD31, PPVDD32, PPVSS21, and PPVSS22 arranged in the second and third layers above the data control and internal voltage generator 40 are separated and applied to respective DC voltage generators. That is, the peripheral circuit power lines PPVSS21 and PPVSS22 are separated from the pad PVSS and applied to the respective internal voltage generators, and the peripheral circuit power lines PPVDD31 and PPVDD32 are separated from the pad PVDD and applied to the respective internal voltage generators.

The method of power line arrangement in the semiconductor memory device of FIG. 9 separates the power lines from the pad and directly applies them to the respective internal voltage generators, so that effect on level variation of the power lines is small, thereby stably supplying the electrical power to the device.

In the fourth embodiment of FIG. 9, the peripheral circuit power lines PPVSS21, PPVSS22, PPVSS31, and PPVSS32 are separated from the upper and lower metal pads of the respective pads PVSS and PVDD. Since it is possible to separate the peripheral circuit power lines PPVSS21, PPVSS22, PPVSS31, and PPVSS32 from the upper metal pad without increasing layout area size due to changed arrangement of the pads PVSS and PVDD, the circuitry can be designed such that the peripheral circuit power lines PPVSS21, PPVSS22, PPVSS31, and PPVSS32 are separated only from the upper metal pads of the respective pads PVSS and PVDD. In the fourth embodiment of FIG. 9, the peripheral circuit power lines PPVSS21, PPVSS22, PPVSS31, and PPVSS32 separated from the respective pads PVSS and PVDD are shown as arranged in a peripheral circuit region but they may be arranged to cross over a memory cell array region. That is, if the internal voltage generators arranged above the memory cell array, they may be arranged to cross over the memory cell array region.

Figure 10A:
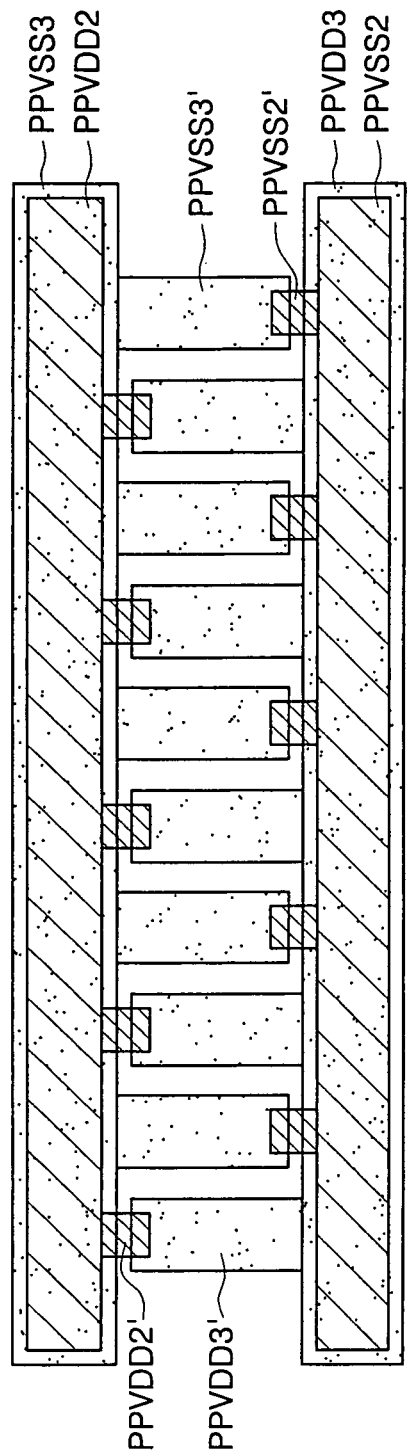
FIGS. 10A and 10B are plan views illustrating power line arrangement method arranged above a memory cell array region and a peripheral circuit region of the semiconductor memory device according to the present invention.
Figure 10B:
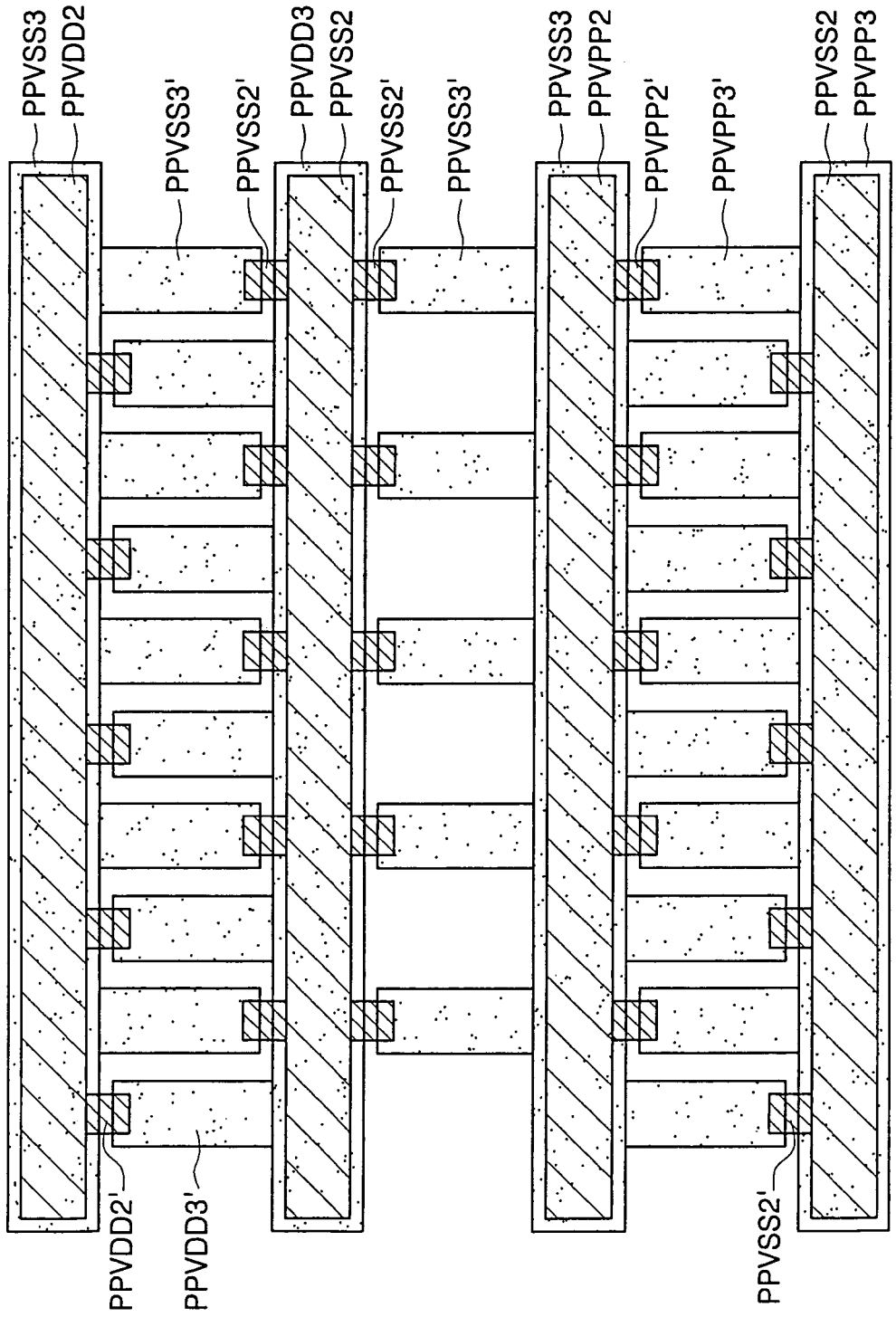

FIGS. 10A and 10B are plan views illustrating power line arrangement method arranged above the memory cell array region and the peripheral circuit region of the semiconductor memory device according to the present invention, where the power lines are arranged in three layers and the power lines arranged in the second and third layers are arranged to overlap.

FIG. 10a shows the two peripheral circuit power lines PPVDD2 and PPVSS2 arranged in the second layer and the two peripheral circuit power lines PPVDD3 and PPVSS3 arranged in the third layer. The peripheral circuit power lines PPVDD2 and PPVSS2 are arranged in the second layer in the same direction, the peripheral circuit power line PPVSS3 is arranged above the peripheral circuit power line PPVDD2 arranged in the second layer, and the peripheral circuit power line PPVDD3 is arranged above the peripheral circuit power line PPVSS2 arranged in the second layer. That is, the peripheral circuit power lines PPVDD3 and PPVSS3 are arranged in the third layer. A plurality of power lines for connection between the peripheral circuit power line PPVDD2 arranged in the second layer and the neighboring peripheral circuit power line PPVDD3 arranged in the third layer are arranged in a perpendicular direction to the peripheral circuit power lines PPVDD2 and PPVDD3. Likewise, a plurality of power lines for connection between the peripheral circuit power line PPVSS2 arranged in the second layer and the neighboring peripheral circuit power line PPVSS3 arranged in the third layer are arranged in a perpendicular direction to the peripheral circuit power lines PPVSS2 and PPVSS3. That is, a plurality of sub peripheral circuit power lines PPVDD2' which extend from the peripheral circuit power line PPVDD2 are arranged in the second layer, and a plurality of sub peripheral circuit power lines PPVSS2' which extend from the peripheral circuit power line PPVSS2 are arranged in the second layer. Also, a plurality of sub peripheral circuit power lines PPVSS3' which extend from the peripheral circuit power line PPVSS3 are arranged in the third layer, and a plurality of sub peripheral circuit power lines PPVDD3' which extend from the peripheral circuit power line PPVDD3 are arranged in the third layer. Even though not shown, a connection is formed between the sub peripheral circuit power line PPVSS2' arranged in the second layer and the sub peripheral circuit power line PPVDD3' arranged in the third layer, and a connection is formed between the sub peripheral circuit power line PPVDD2' arranged in the second layer and the sub peripheral circuit power line PPVSS3' arranged in the third layer.

FIG. 10B shows the four peripheral circuit power lines PPVDD2, PPVSS2, PPVPP2, and PPVSS2 arranged in the second layer and the four peripheral circuit power lines PPVSS3, PPVDD3, PPVSS3, and PPVPP3 arranged in the third layer. The peripheral circuit power lines PPVDD2, PPVSS2, PPVPP2, and PPVSS2 are arranged in the second layer in the same direction, and the peripheral circuit power lines PPVSS3, PPVDD3, PPVSS3, and PPVPP3 are arranged in the third layer to overlap the peripheral circuit power lines PPVDD2, PPVSS2, PPVPP2, and PPVSS2 arranged in the second layer. A plurality of power lines for connection between the peripheral circuit power line PPVDD2 arranged on the second layer and the neighboring peripheral circuit power line PPVDD3 arranged on the third layer are arranged in a perpendicular direction to the peripheral circuit power lines PPVDD2 and PPVDD3. Likewise, a plurality of power lines for connection between the peripheral circuit power line PPVSS2 arranged in the second layer and the neighboring peripheral circuit power line PPVSS3 arranged in the third layer are arranged on the third layer in a perpendicular direction to the peripheral circuit power lines PPVSS2 and PPVSS3. A plurality of power lines for connection between the peripheral circuit power line PPVPP2 arranged in the second layer and the neighboring peripheral circuit power line PPVPP3 arranged in the third layer are arranged in a perpendicular direction to the peripheral circuit power lines PPVPP2 and PPVPP3. That is, a plurality of sub peripheral circuit power lines PPVDD2' which extend from the peripheral circuit power line PPVDD2 are arranged in the second layer, a plurality of sub peripheral circuit power lines PPVSS2' which extend from the peripheral circuit power line PPVSS2 are arranged in the second layer, and a plurality of sub peripheral circuit power lines PPVPP2' which extend from the peripheral circuit power line PPVPP2 are arranged in the second layer. Also, a plurality of sub peripheral circuit power lines PPVSS3' which extend from the peripheral circuit power line PPVSS3 are arranged in the third layer, a plurality of sub peripheral circuit power lines PPVDD3' which extend from the peripheral circuit power line PPVDD3 are arranged in the third layer, and a plurality of sub peripheral circuit power lines PPVPP3' which extend from the peripheral circuit power line PPVPP3 are arranged in the third layer. Even though not shown, a connection is formed between the sub peripheral circuit power line PPVSS2' arranged in the second layer and the sub peripheral circuit power line PPVDD3' arranged in the third layer, a connection is formed between the sub peripheral circuit power line PPVDD2' arranged in the second layer and the sub peripheral circuit power line PPVSS3' arranged in the third layer, and a connection is formed between the sub peripheral circuit power line PPVPP2' arranged in the second layer and the sub peripheral circuit power line PPVPP3' arranged in the third layer.

In the method of power line arrangement in the semiconductor memory device of FIGS. 10A and 10B, there exists a voltage difference between the power lines which are arranged to overlap, so that a capacitor is formed between the lines. The capacitor functions as a filter to reduce noise of the power lines, whereby stable electrical power can be supplied.

In the embodiment of FIGS. 10A and 10B, the power lines are arranged in the second and third layers to overlap, but the embodiment of FIGS. 10A and 10B can be applied to a case where the power lines above the memory cell array region and the peripheral circuit region are arranged in the first and second layers to overlap.

In the power line arrangement of the semiconductor memory device according to the present invention, the pads are arranged in a single line, but the pads may be arranged in two or more lines or in various forms like circular or matrix form.

In the power line arrangement of the semiconductor memory device according to the present invention, when the array and peripheral circuit power lines for supplying the electrical power to the memory cell array and the peripheral circuit are arranged in two or three layers, the power lines for connecting the pads to which the same level of electrical power is applied without increasing the layout area size are stacked together with the upper and lower metal pads of the pads.

The power line arrangement of the present invention can be applied to other semiconductor devices as well as the semiconductor memory device.

In the above described embodiments of the present invention, two kinds of electrical powers, i.e., a power voltage and a ground voltage, are applied from an external portion. The present invention can be applied to a case where three or more kinds of electrical powers, i.e., a power voltage, a ground voltage, a substrate voltage, a reference voltage, and a high voltage, are externally applied.

As described herein before, the semiconductor memory device and the power line arrangement method according to the present invention can form connections between the pads which are supplied with the same level of electrical power without increasing the layout area size and can supply more stable electrical power.

Also, the semiconductor memory device and the power line arrangement method according to the present invention can generate a stable internal voltage by applying the electrical power directly to the pads from a predetermined number of internal voltage generators which generate different level of internal voltages.

Further, the semiconductor memory device and the power line arrangement method according to the present invention can supply the noise-stable electrical power by arranging the power lines which transmit the different electrical powers to overlap.

What is claimed is:

1. A semiconductor memory device, comprising:
   a plurality of pads, each pad including an upper pad layer and a lower pad layer arranged below the upper pad layer, the plurality of pads including:
      (i) a first set of pads to be supplied with a first level of electrical power, and
      (ii) a second set of pads to be supplied with a second level of electrical power;
   a first pad power line arranged below the lower pad layers of the plurality of pads, the first pad power line extending in a direction crossing the plurality of pads so as to connect the first set of pads to each other; and
   a second pad power line arranged below the lower pad layers of the plurality of pads, the second pad power line extending in the direction crossing the plurality of pads so as to connect the second set of pads to each other.

2. The device of claim 1, wherein the upper and lower pad layers and the first and second pad power lines are made of a metal.

3. The device of claim 1, wherein the upper and lower pad layers are made of a metal, and
   the first and second pad power lines are made of tungsten.

4. The device of claim 1, wherein the upper and lower pad layers of each of the plurality of pads are electrically connected, and
   the lower pad layers of the first set of pads and the first pad power line are electrically interconnected, and
   the lower pad layers of the second set of pads and the second pad power line are electrically interconnected.

5. The device of claim 1, wherein the first and second pad power lines transmit at least one of a power voltage power and a ground voltage power.

6. The device of claim 1, wherein the first and second pad power lines transmit at least one of a power voltage power, a ground voltage power, a substrate voltage power, a high voltage power, and a reference voltage power.

7. The device of claim 1, further comprising:
   a first sub pad power line arranged in a perpendicular direction to the first pad power line; and
   a second sub pad power line arranged in a perpendicular direction to the second pad power line.

8. The device of claim 7, wherein the first pad power line and the first sub pad power line transmit the same level of electrical power and are arranged in the same layer, and
   the second pad power line and the second sub pad power line transmit the same level of electrical power and are arranged in the same layer.

9. The device of claim 8, wherein the upper and lower pad layers are made of a metal, and
   the first and second pad power lines and the first and second sub pad power lines are made of tungsten.

10. The device of claim 8, wherein the upper and lower pad layers, the first and second pad power lines, and the first and second sub pad power lines are made of a metal.

11. The device of claim 7, wherein the first pad power line and the first sub pad power line transmit a different level of electrical power than the second pad power line and the second sub pad power line, and
   the first and second sub pad power lines are arranged below a layer in which the first and second pad power lines are arranged.

12. The device of claim 11, wherein the upper and lower pad layers and the first and second pad power lines are made of a metal, and
   the first and second sub pad power lines are made of tungsten.

13. The device of claim 11, wherein the upper and lower pad layers, the first and second pad power lines, and the first and second sub pad power lines are made of a metal.

14. The device of claim 7, wherein the upper and lower pad layers of each of the plurality of pads are electrically connected,
   the lower pad layers of the first set of pads, the first power line, and the first sub pad power line are electrically interconnected, and
   the lower pad layers of the second set of pads, the second power line, and the second sub power line are electrically interconnected.

15. The device of claim 7, wherein the first and second pad power lines transmit at least one of a power voltage power and a ground voltage power.

16. The device of claim 7, wherein the first and second pad power lines transmit at least one of a power voltage power, a ground voltage power, a substrate voltage power, a high voltage power, and a reference voltage power.

17. The device of claim 1, further comprising:
   a memory cell array;
   a peripheral circuit for controlling data input/output to/from the memory cell array; and
   array and peripheral circuit power lines for supplying the electrical power to the memory cell array and the peripheral circuit arranged above the memory cell array and the peripheral circuit;
   wherein the electrical power is applied from the outside of the device, and
   the upper and the lower pad layers of each of the plurality of pads are arranged in two layers which are the same layers as the array and peripheral circuit power lines.

18. The device of claim 17, wherein the array and peripheral circuit power lines are arranged in three layers in a perpendicular direction to each other,
   the first and second pad power lines are arranged in a first layer,
   the lower pad layers are arranged in a second layer, and
   the upper pad layers are arranged in a third layer.

19. The device of claim 18, further comprising:
   a first sub pad power line arranged in a perpendicular direction to the first pad power line; and
   a second sub pad power line arranged in a perpendicular direction to the second pad power line,
   wherein the first and second sub pad power lines are arranged in a dummy portion formed below the lower pad layers for matching a step height with the memory cell array and the peripheral circuit.

20. The device of claim 19, wherein the upper and lower pad layers and the first and second pad power lines are made of a metal, and
   the first and second sub pad power lines are made of tungsten.

21. The device of claim 18, wherein the peripheral circuit includes a predetermined number of internal voltage generators which generate different level of voltages, and
   a predetermined number of power lines for supplying the respective internal voltage generators with the electrical power from the upper pad layers of the plurality of pads are arranged on the same layer as the upper pad layers.

22. The device of claim 21, wherein a predetermined number of the power lines for supplying the respective internal voltage generators with the electrical power from the lower pad layers of the plurality of pads are arranged on the same layer as the lower pad layers.

23. The device of claim 17, wherein the array and peripheral circuit power lines are arranged in two layers, and
the first and second pad power lines are arranged in a dummy portion formed below the lower pad layers to match a step height with a region where the memory cell array and the peripheral circuit.

24. The device of claim 23, wherein the upper and lower pad layers are made of a metal, and
the first and second pad power lines are made of tungsten.

25. The device of claim 17, wherein first and second sub pad power lines are additionally arranged in a perpendicular direction to the first and second pad power lines,
the first and second pad power lines and the upper and lower pad layers are separately arranged in different three layers,
some of the first and second sub pad power lines are arranged in the same layer as the first and second pad power lines, and
the rest of the first and second sub power lines are arranged in a different layer from the first and second pad power lines and the upper and lower pad layers.

26. The device of claim 25, wherein the first and second pad power lines, the upper and lower pad layers, and the first and second sub pad power lines are made of a metal.

27. The device of claim 17, wherein the array and peripheral circuit power lines are arranged in at least two layers to overlap, and
the power lines arranged to overlap transmit different level of electrical powers.

28. The device of claim 27, wherein one of the power lines arranged to overlap and one of the power lines arranged to overlap adjacent to the power lines arranged to overlap are lines transmitting the same level of electrical power, and one of the power lines which transmit the same level of electrical power and are arranged to overlap and one of the adjacent power lines arranged to overlap are arranged in different layers.

29. The device of claim 17, wherein the array and peripheral circuit power lines are arranged in at least three layers including the at least two layers,
the array and peripheral circuit power lines arranged in the at least two layers among the at least three layers are arranged to overlap, and
the power lines arranged to overlap are lines which transmit different levels of electrical power.

30. The device of claim 29, wherein one of the power lines arranged to overlap and one of the power lines arranged to overlap adjacent to the power lines arranged to overlap are lines transmitting the same level of electrical power, and one of the power lines which transmits the same level of electrical power and are arranged to overlap and one of the adjacent power lines arranged to overlap are arranged in different layers.

31. The device of claim 29, wherein the upper and lower pad layers of each of the plurality of pads are arranged in two layers which are the same layers as the array and peripheral circuit power lines, and
the first and second pad power lines crossing the pads are arranged below the lower pad layers of the plurality of pads to connect the pads which transmit the same level of electrical power among the plurality of pads.

32. The device of claim 31, wherein the array and peripheral circuit power lines are arranged in three layers in a perpendicular direction to each other,
the first and second pad power lines are arranged in a first layer,
the lower pad layers are arranged in a second layer, and
the upper pad layers are arranged in a third layer.

33. The device of claim 32, further comprising:
a first sub pad power line arranged in a perpendicular direction to the first pad power line; and
a second sub pad power line arranged in a perpendicular direction to the second pad power line,
wherein the first and second sub pad power lines are arranged in a dummy portion formed below the lower pad layers for matching a step height with the memory cell array and the peripheral circuit.

34. The device of claim 31, wherein the peripheral circuit includes a predetermined number of internal voltage generators which generate different levels of voltages, and
a predetermined number of power lines for supplying the respective internal voltage generators with the electrical power from the upper pad layers of the plurality of pads arranged in the same layer as the upper pad layers.

35. The device of claim 34, wherein a predetermined number of the power lines for supplying the respective internal voltage generators with the electrical power from the lower pad layers of the plurality of pads are arranged in the same layer as the lower pad layers.

* * * * *